(12) United States Patent
Sabah

(10) Patent No.: US 12,207,442 B2
(45) Date of Patent: Jan. 21, 2025

(54) HOUSING COMPRISING A COMPOSITE WALL INTEGRATING AT LEAST ONE COOLING CONDUIT

(71) Applicant: Safran Electronics & Defense, Paris (FR)

(72) Inventor: Muriel Sabah, Moissy-Cramayel (FR)

(73) Assignee: Safran Electronics & Defense, Paris (FR)

( * ) Notice: Subject to any disclaimer, the term of this patent is extended or adjusted under 35 U.S.C. 154(b) by 111 days.

(21) Appl. No.: 17/738,905

(22) Filed: May 6, 2022

(65) Prior Publication Data

US 2022/0361370 A1 Nov. 10, 2022

(30) Foreign Application Priority Data

May 10, 2021 (FR) ...................................... 2104913

(51) Int. Cl.
*H05K 7/20* (2006.01)
*H01L 23/427* (2006.01)
*H01L 23/473* (2006.01)

(52) U.S. Cl.
CPC ....... *H05K 7/20336* (2013.01); *H01L 23/427* (2013.01); *H01L 23/473* (2013.01); *H05K 7/20254* (2013.01); *H05K 7/20263* (2013.01); *H05K 7/20309* (2013.01); *H05K 7/20318* (2013.01); *H05K 7/20409* (2013.01); *H05K 7/20509* (2013.01)

(58) Field of Classification Search
CPC ........... H05K 7/20254; H05K 7/20263; H05K 7/20309; H05K 7/20318; H05K 7/20336; H05K 7/20409; H05K 7/20509; H01L 23/427; H01L 23/473
See application file for complete search history.

(56) References Cited

U.S. PATENT DOCUMENTS

| | | | |
|---|---|---|---|
| 9,750,127 B2* | 8/2017 | Kim | ........................ H05K 13/04 |
| 11,324,143 B2* | 5/2022 | Stefanoski | ......... H05K 7/20509 |
| 2002/0172010 A1 | 11/2002 | Sarno et al. | |
| 2013/0322024 A1 | 12/2013 | Thales | |

(Continued)

FOREIGN PATENT DOCUMENTS

| | | | |
|---|---|---|---|
| FR | 2803166 A1 | 6/2001 | |
| FR | 2969379 A1 | 6/2012 | |

(Continued)

OTHER PUBLICATIONS

France Patent Application No. 2104913, Search Report (Notification of RRP with Obligation to Respond), dated Dec. 14, 2021.

*Primary Examiner* — Robert J Hoffberg
(74) *Attorney, Agent, or Firm* — Kilpatrick Townsend & Stockton LLP

(57) ABSTRACT

The disclosure relates to a housing comprising at least one composite wall comprising woven or braided carbon fibers covered with a thermoplastic or thermosetting resin, an electronic card carrying electronic components, and a heat transfer device having at least one portion facing an electronic component to be cooled of the electronic card, said heat transfer device being inserted inside the composite wall, the heat transfer device comprising at least one cooling conduit containing a cooling fluid.

11 Claims, 6 Drawing Sheets

(56) References Cited

U.S. PATENT DOCUMENTS

2016/0095197 A1* 3/2016 Lee .................... H05K 1/0203
                                                      361/700
2016/0168441 A1   6/2016 Safran

FOREIGN PATENT DOCUMENTS

| FR | 3008921 A1    |   | 1/2015 |              |
|----|---------------|---|--------|--------------|
| FR | 3091140 A1    |   | 6/2020 |              |
| JP | 2002120310 A  | * | 4/2002 | ......... F28D 15/0233 |

* cited by examiner

HOUSING COMPRISING A COMPOSITE WALL INTEGRATING AT LEAST ONE COOLING CONDUIT

CROSS REFERENCE TO RELATED APPLICATIONS

This application is related to and claims priority benefits from France Patent Application No. 21/04913, filed on May 10, 2021, the entire contents of which are hereby incorporated by this reference.

FIELD OF THE DISCLOSURE

The present disclosure relates to a housing comprising a composite wall incorporating at least one cooling conduit. In the field of aeronautics, on-board electronic boxes are subjected to severe environments in which the electronic components dissipate calories in a reduced space due to size constraints. Very high surrounding temperatures can range from 80° C. (typical value) up to 180° C.

BACKGROUND

Document FR3091140 teaches the production of a heat transfer device comprising metal inserts arranged inside a composite wall allowing a significant gain in mass. However, the conductivity of such a device remains limited even with carbon fibers with high thermal conductivity. Indeed, prototypes and thermal tests have shown that this device is sufficient to operate electronic cards carrying components dissipating no more than 5 W. However, the composite material equipped with local metal inserts does not allow to cooling of micro-processors dissipating high powers, in particular greater than 7 W.

SUMMARY

The terms "invention," "the invention," "this invention" "the present invention," "disclosure," "the disclosure," and "the present disclosure," used in this patent are intended to refer broadly to all of the subject matter of this patent and the patent claims below. Statements containing these terms should be understood not to limit the subject matter described herein or to limit the meaning or scope of the patent claims below. Embodiments of the invention covered by this patent are defined by the claims below, not this summary. This summary is a high-level overview of various aspects of the invention and introduces some of the concepts that are further described in the Detailed Description section below. This summary is not intended to identify key or essential features of the claimed subject matter, nor is it intended to be used in isolation to determine the scope of the claimed subject matter. The subject matter should be understood by reference to appropriate portions of the entire specification of this patent, any or all drawings and each claim.

The disclosure aims at effectively remedying this drawback by proposing a box comprising:
- at least one composite wall comprising woven or braided carbon fibers covered with a thermoplastic or thermosetting resin,
- an electronic card carrying electronic components,
- a heat transfer device having at least one portion facing an electronic component to be cooled of the electronic card, said heat transfer device being inserted inside the composite wall, the heat transfer device comprising at least one cooling conduit containing a cooling fluid.

The disclosure thus makes it possible, by integrating a conduit containing a cooling fluid in a composite wall of the housing, to produce a compact cooling device of reduced mass having a high thermal conductivity. The disclosure thus makes it possible to cool very hot zones of the electronic card on which are mounted microprocessors capable of dissipating powers greater than 7 W on small surfaces, in particular of the order of 15 mm$^2$.

The disclosure also makes it possible to protect the cooling conduit(s) from all external attacks, in particular from a risk of wear by humidity as well as from any risk of breakage due to the severe vibrations to which the electronic components are subjected. The disclosure also makes it possible to facilitate a mounting of the electronic cards in the electronic box by avoiding an additional operation of positioning the cooling conduit(s).

According to one embodiment of the disclosure, the cooling conduit is flush with an outer surface of the composite wall while being protected by resin.

According to one embodiment of the disclosure, a compressible thermal interface is arranged between the electronic component to be cooled and the composite wall in which the cooling conduit is inserted.

According to one embodiment of the disclosure, the heat transfer device comprises a diphasic loop provided with at least one cooling conduit containing a cooling fluid in the vapor state in an evaporation zone and in the liquid state in a condensing zone.

According to one embodiment of the disclosure, the diphasic loop comprises at least one heat pipe having a hot end close to the electronic component to be cooled and a cold end close to an edge of the housing outside the composite wall.

According to one embodiment of the disclosure, the diphasic loop is a diphasic capillary-pumping loop, in particular of the CPL (Capillary pump Loop) type, or LHP (Loop Heat Pipe) type.

According to one embodiment of the disclosure, the heat transfer device comprises a plate, so-called "cold plate," made of a heat-conducting material, in which is provided at least one circulation conduit for the cooling fluid in the liquid phase.

According to one embodiment of the disclosure, the conduit of the cold plate is intended to be connected to an available fluid circuit in an aircraft, such as a fuel circuit.

According to one embodiment of the disclosure, the heat transfer device comprises an insert made of a metallic material comprising at least one bore forming the cooling conduit.

According to one embodiment of the disclosure, the insert comprises a plurality of cooling fins extending towards the outside of said housing.

According to one embodiment of the disclosure, the electronic card is mounted on a support secured to the composite wall in such a way that the electronic card is raised relative to the composite wall.

According to one embodiment of the disclosure, the support comprises at least one bore forming a conduit for the passage of a cooling fluid.

According to one embodiment of the disclosure, the carbon fibers have a thermal conductivity comprised between 300 W/m/K and 800 W/m/K.

The disclosure further relates to a method for producing a thermal cooling housing comprising:

a step of producing a dry fiber preform comprising carbon fibers, a step of inserting a cooling conduit inside the fiber preform, and a step of injecting resin inside a mold in which are arranged the fiber preform and the cooling conduit.

According to one embodiment of the disclosure, as the fiber preform is obtained by stacking sheets of carbon fibers, the cooling conduit is arranged between two sheets of the fiber preform, in particular between a penultimate sheet in the stack and a last sheet in the stack.

BRIEF DESCRIPTION OF THE DRAWINGS

The disclosure will be better understood and other characteristics and advantages will appear by reading the following detailed description, which includes embodiments given for illustrative purposes with reference to the accompanying figures, presented as way of non-limiting examples, which may serve to complete the understanding of the present disclosure and the description of its implementation and eventually contribute to its definition, wherein.

DETAILED DESCRIPTION

It should be noted that the structural and/or functional elements common to the different embodiments have the same references. Thus, unless otherwise stated, such elements have identical structural, dimensional and material properties.

Figure 1:
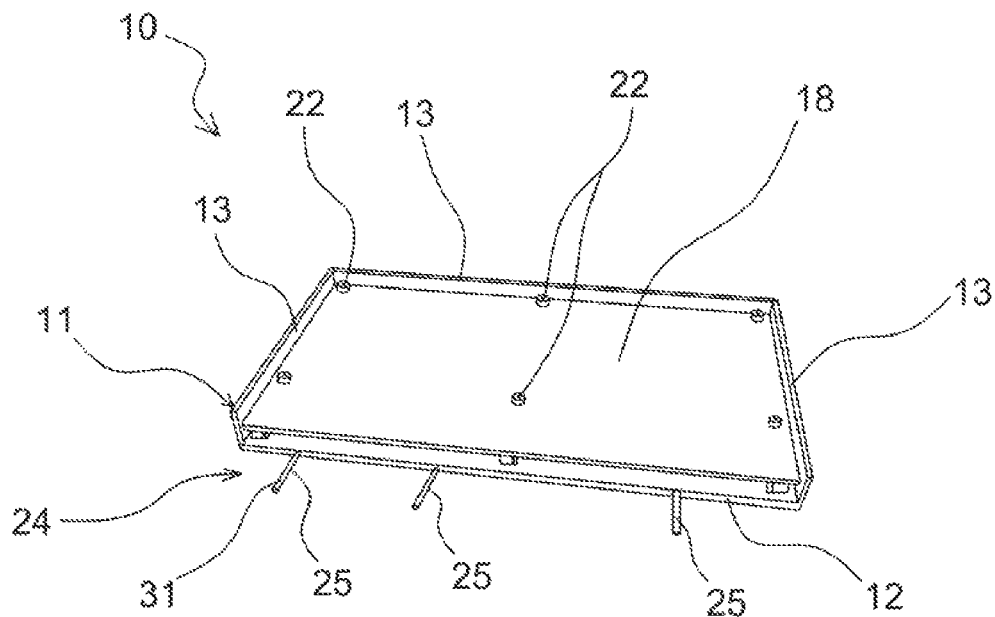
FIG. 1 is a perspective view of a composite housing with an integrated cooling conduit according to the disclosure.

FIG. 1 shows a housing 10 comprising a structure 11 having a base composite wall 12 and side composite walls 13 extending from the wall 12. A composite wall 12, 13 comprises woven or braided carbon fibers 15 covered with a thermoplastic or thermosetting resin 16, as shown in FIG. 3.

Figure 2:
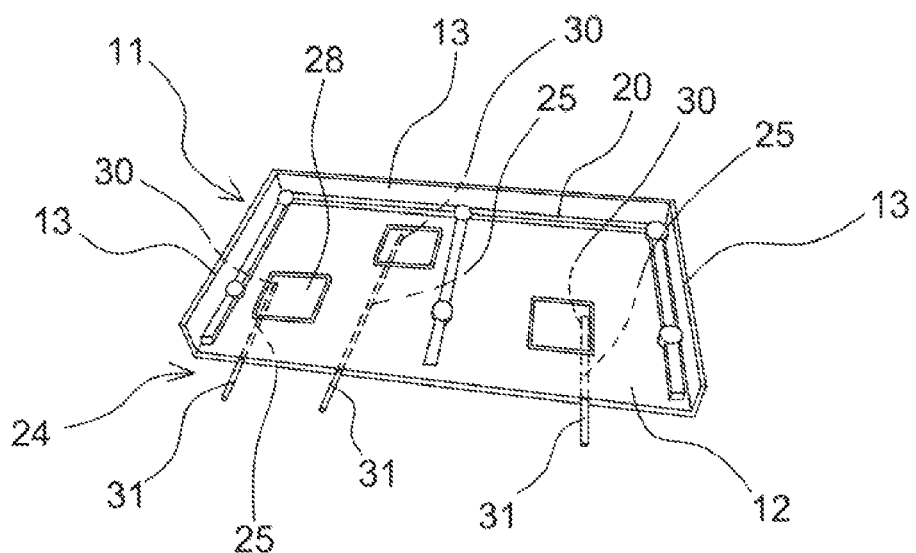
FIG. 2 is a perspective view of a composite housing with an integrated cooling conduit according to the disclosure without the electronic card.
Figure 3:
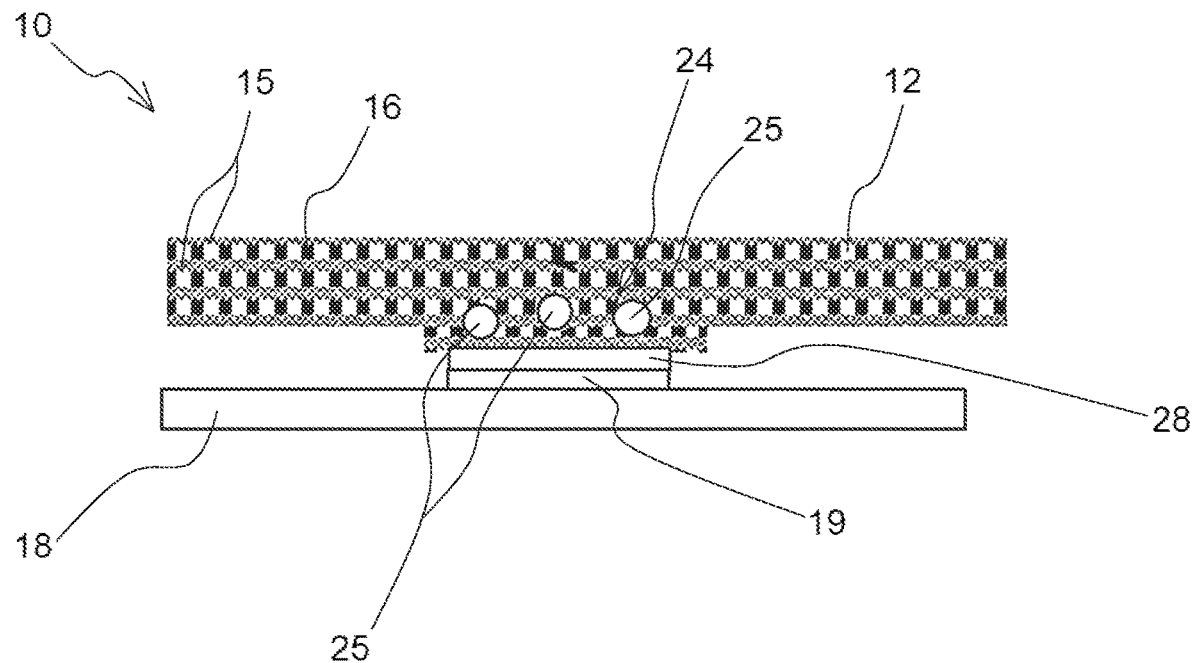
FIG. 3 is a partial cross-sectional view of a composite housing according to the disclosure illustrating a first embodiment of cooling conduits.

An electronic card 18 visible in FIGS. 1 and 3 and carrying electronic components 19 is mounted on a support 20 mechanically linked to the wall 12 (see FIG. 2). For this purpose, the electronic card 18 can be fixed on the support 20 by means of fixing members 22, such as fixing screws, or a locking slide, or any other fixing means suitable for the application.

The electronic card 18 is thus raised relative to the composite wall 12. An electronic component 19 to be cooled is carried by one face of the electronic card 18 located on the composite wall 12 side. The base composite wall 12, the side walls 13, as well as the electronic card 18 thus form an housing. The housing is closed by a lid (not shown).

A heat transfer device 24 comprises at least one cooling conduit 25 containing a cooling fluid. The cooling conduit 25 is inserted inside the composite wall 12. At least a portion of the cooling conduit 25 is facing the electronic component 19 to be cooled.

Advantageously, several cooling conduits 25 are arranged inside the composite wall 12. The number of cooling conduits 25 is however reduced, in particular less than or equal to 5, in order to limit the mass of the assembly.

The carbon fibers 15 with a high thermal conductivity arranged around the cooling conduits 25 ensure the homogeneity of the temperature of the housing 10 towards the lowest possible temperature. The carbon fibers 15 advantageously have a thermal conductivity comprised between 300 W/m/K and 800 W/m/K. Such a level of thermal conductivity makes it possible to have fibers that can be handled, without being too brittle. This type of fiber thus makes it possible to produce any curved shapes having radii of curvature that can match the rounded shapes of the cooling conduits 25.

Preferably, the cooling conduits 25 are flush with an outer surface of the composite wall 12 while being protected by resin 16. This makes it possible to avoid any risk of galvanic corrosion between the material of a conduit 25 and the carbon fibers 15.

As can be seen in FIG. 3, a compressible thermal interface 28 is arranged between the electronic component 19 to be cooled and the composite wall 12 in which the cooling conduit 25 is inserted. The compressible thermal interface 28 fills the gap and surface roughness while decreasing an induced thermal contact resistance. The thermal interface 28 has a greater thermal conductivity than air, for example between 2 W/m/K and 10 W/m/K. The thermal interface 28 may take the form of a thermal gel or a thermal cushion or a thermal sheet or a phase-change material.

Advantageously, the heat transfer device 24 takes the form of a diphasic loop. As can be seen in FIG. 2, a cooling conduit 25 can then form a heat pipe having a hot end 30 close to the electronic component 19 to be cooled and a cold end 31 close to an edge of the housing 10 outside the composite wall 12. The hot end 30 thus corresponds to an evaporation zone of the cooling fluid which can extract calories from the electronic component 19 to be cooled while the cold end 31 corresponds to a condensation zone of the cooling fluid which can transfer the stored calories to the external environment. The liquid phase and vapor phase of the fluid of a heat pipe are located in the same conduit. The heat pipe may take the form of a micro-heat pipe or a pulsed heat pipe.

Other types of diphasic loops can be envisaged, such as for example a diphasic capillary-pumping loop of the CPL (Capillary pump Loop) type, or LHP (Loop Heat Pipe) type. In this case, the liquid conduit and vapor conduit are separated from each other. A passive pumping system enables the system to be activated.

The cooling conduits 25 are advantageously made of copper or any other material suitable for the application. Due to the integration of the conduits inside the composite wall 12, it is possible to use fluids other than water, in particular alcohol-based fluids, insofar as a diphasic loop does not run the risk, in the event of breakage, of releasing prohibited flammable products in the electronic components located in sensitive areas of an airplane engine.

Figure 4:
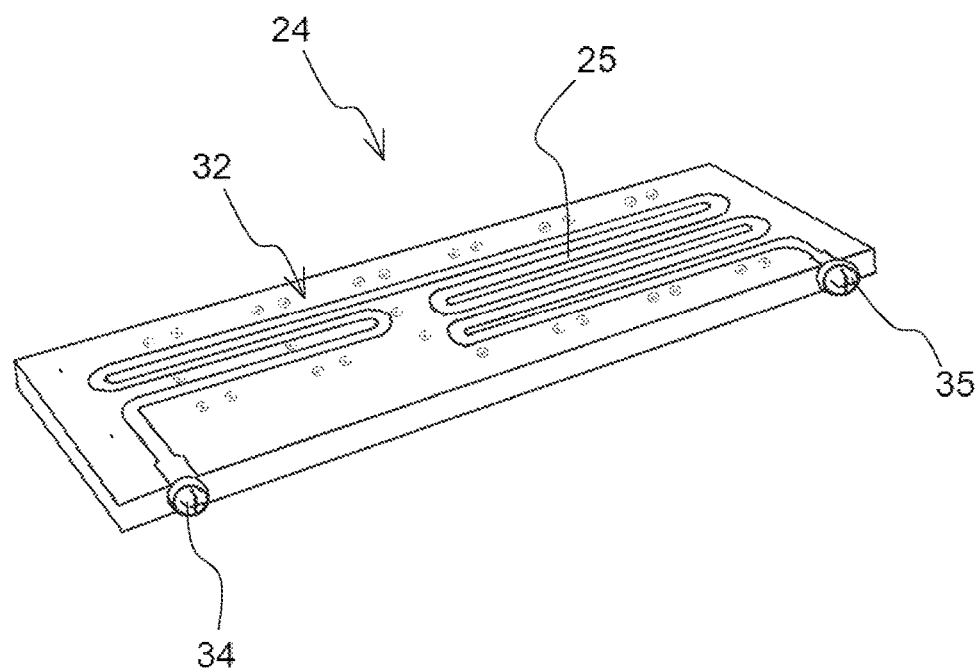
FIG. 4 is a perspective view of a cooling circuit of "cold plate" type which can be integrated into the composite housing according to the present disclosure.

In the embodiment of FIG. 4, the heat transfer device 24 inserted inside the composite wall 12 comprises a plate 32, so-called "cold plate", made of a heat-conducting material, in which is formed at least one circulation conduit 25 for a cooling fluid in the liquid phase.

The conduit 25 defines an open circuit having an inlet 34 and an outlet 35 for the cooling liquid. The cooling liquid will thus be able to evacuate calories from electronic components 19 during its circulation between the inlet 34 and outlet 35. The temperature of the liquid at the outlet of the cold plate 32 depends on the flow rate thereof inside the plate 32. In order to optimize the cooling process, the conduit 25 may have a serpentine shape.

Advantageously, the cooling liquid comes from a fluid circuit available on an aircraft engine, such as a fuel circuit. For this purpose, the conduit 25 in the cold plate 32 is intended to be connected to the fluid circuit. Once the fluid leaves the cold plate 32, it continues to play its role in the engine.

As a variant, water or oil or any other cooling liquid suitable for the application having a high thermal conductivity may be used.

Alternatively, it is possible to create a closed cooling circuit by using a pumping system (not shown) ensuring the circulation of the liquid between the inlet 34 and outlet 35 for the cooling liquid.

The cooling conduits 25 in FIGS. 2 and 3 are added profile-shaped conduits. The cooling conduits 25 may have a cylindrical shape. A section of the cooling conduits 25 may be round, square, rectangular, or rectangular with rounded edges, or any shape suitable for the application.

Figure 5A:
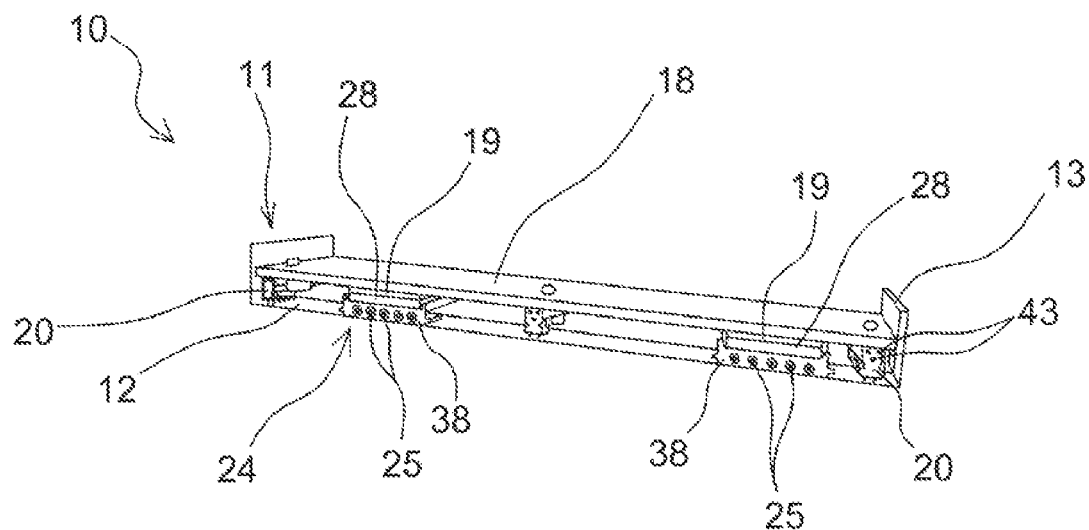
FIGS. 5a, 5b, and 5c are sectional views of a composite housing according to the disclosure illustrating a second embodiment of cooling conduits.
Figure 5B:
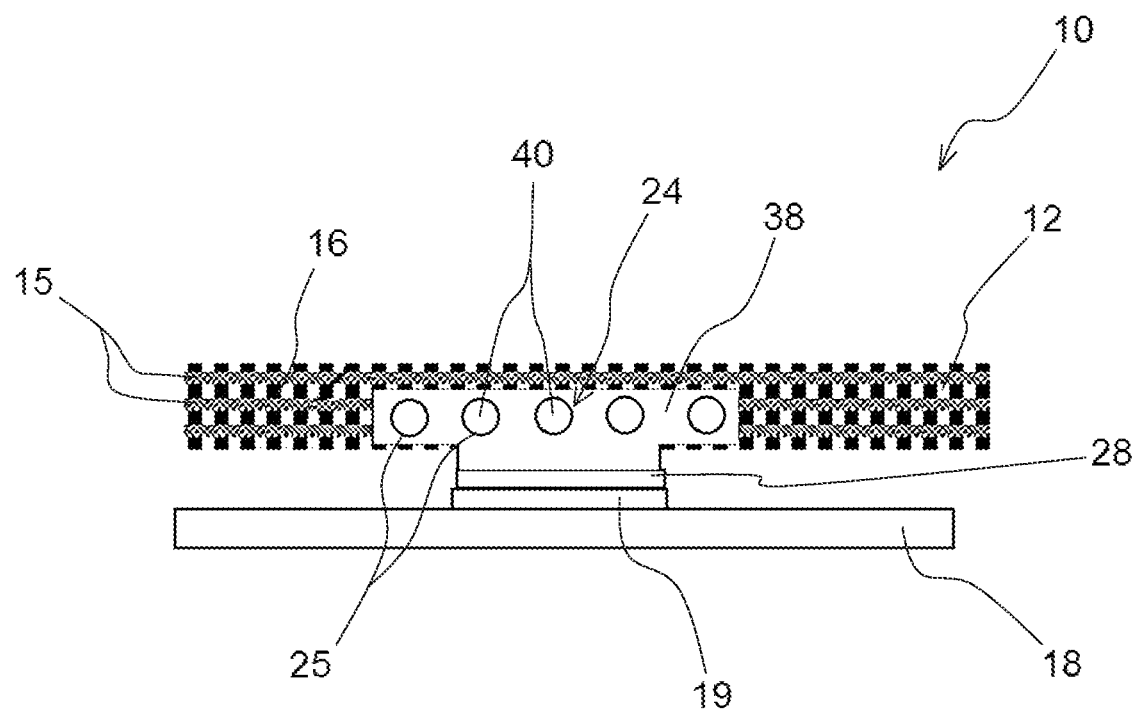
Figure 5C:
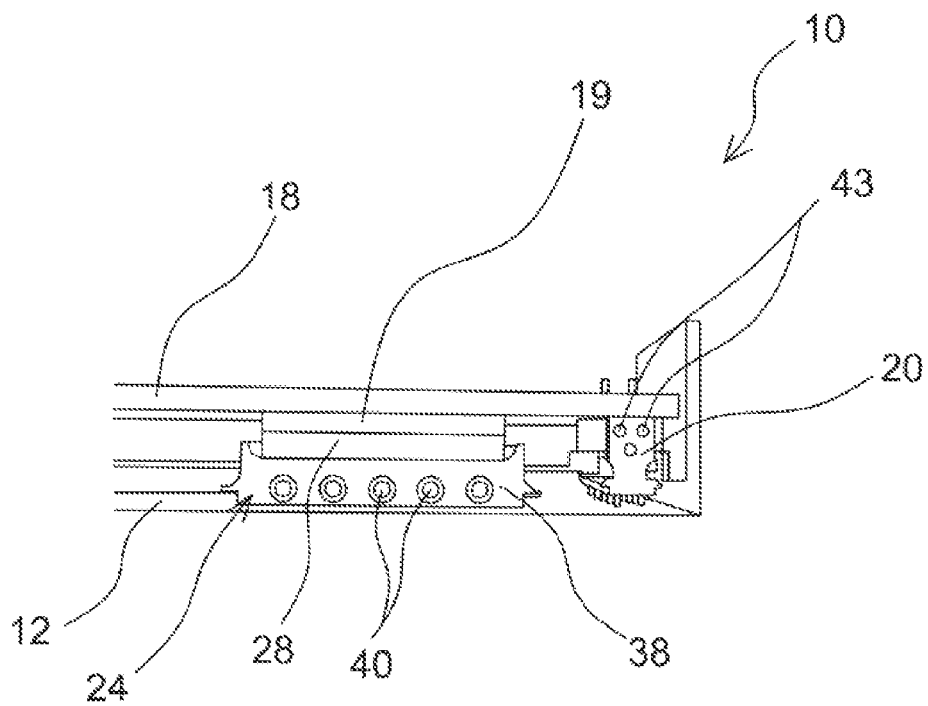

In the embodiment of FIGS. 5a, 5b, and 5c, the heat transfer device 24 comprises at least one insert 38 made of a metallic material comprising a plurality of holes 40 forming the cooling conduits 25. The dimensioning of the holes 40 depends on the desired thermal efficiency and the pressure drop not to be exceeded. The insert 38 can be made by a metal additive manufacturing process.

Figure 6A:
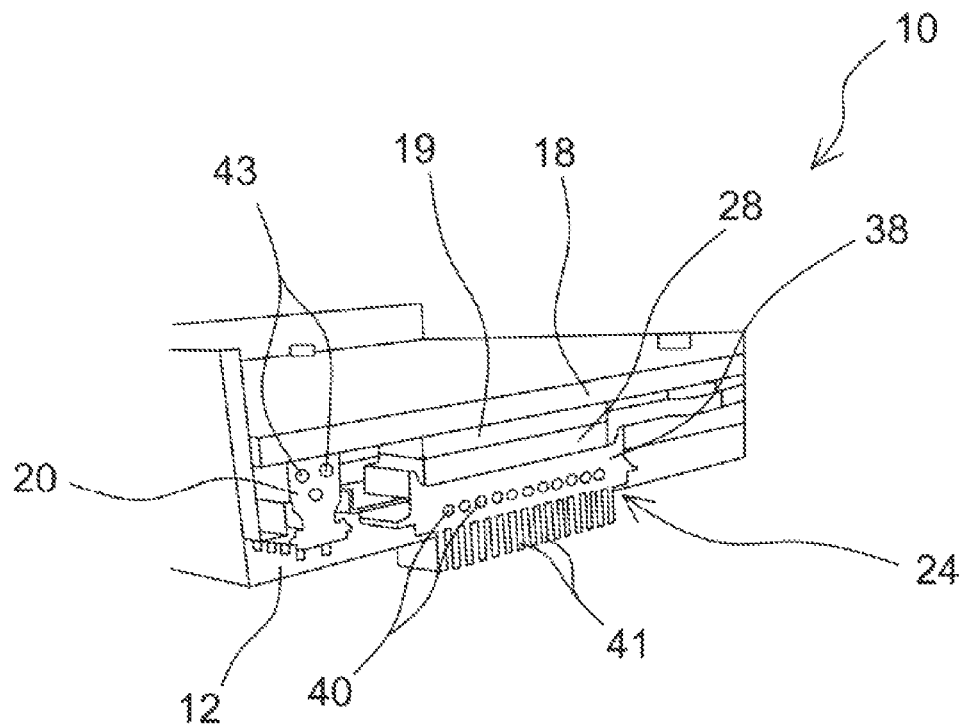
FIGS. 6a and 6b are partial sectional views of a composite housing according to the disclosure illustrating a third embodiment of cooling conduits.
Figure 6B:
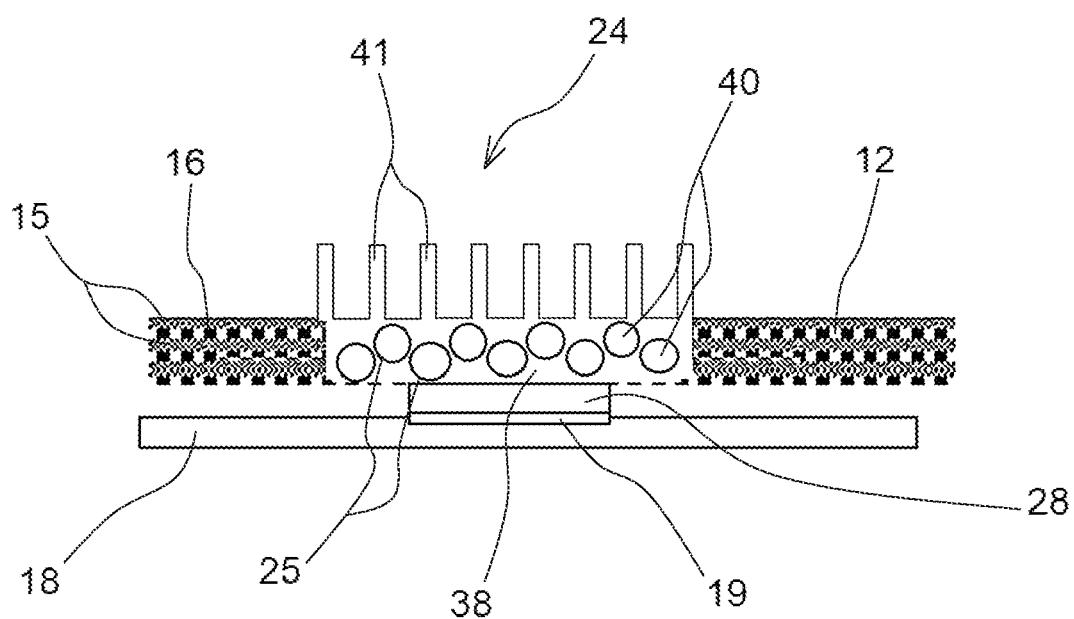

As can be seen in FIGS. 6a and 6b, the insert 38 may comprise a plurality of cooling fins 41 extending outwards said housing 10.

As illustrated in FIGS. 5c and 6a, the support 20 may include holes 43 forming conduits for the passage of a cooling fluid. These conduits may form a diphasic loop or a cooling circuit in which a cooling liquid circulates. In other words, in addition to its function of holding the electronic card 18, the support 20 made of a metallic material may be actively involved in cooling the components 19. The support 20 may comprise several elongated portions so as to extend at least partly along a perimeter of the electronic card 18 (see FIG. 2). The support 20 can be inserted at least partly inside the composite wall 12.

It is given below, with reference to FIGS. 7a and 7b, a description of a method for producing a thermal cooling housing 10.

Figure 7A:
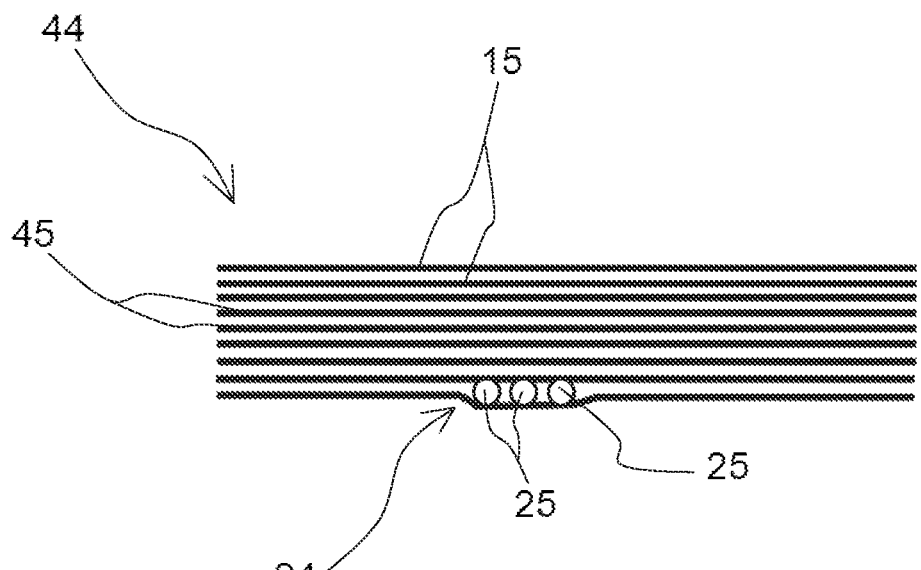
FIGS. 7a and 7b illustrate the various steps of manufacturing a composite housing with an integrated cooling conduit according to the disclosure.

This method comprises a step of producing a dry fiber preform 44 as well as a step of inserting one or more cooling conduits 25 inside the fiber preform 44, as shown in FIG. 7a. The conduit 25 may be an added conduit as shown in FIG. 7a or a conduit formed inside an insert 38 placed inside the fiber preform 44.

Figure 7B:
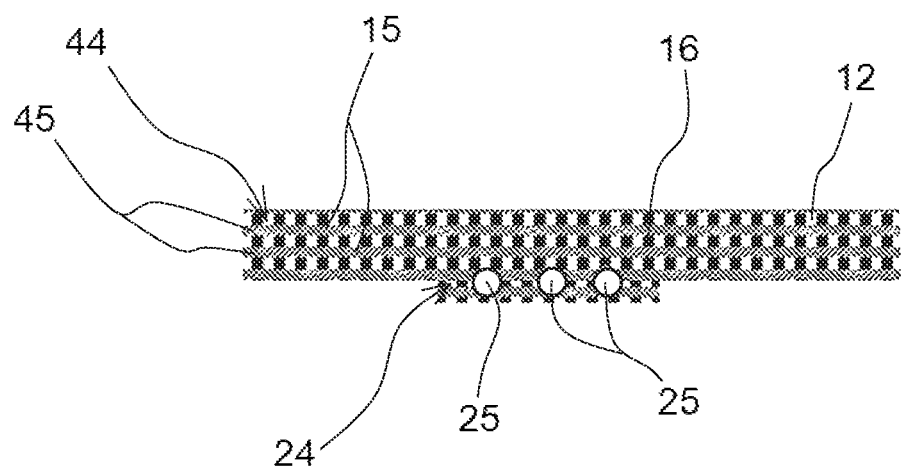

The method also includes a step of injecting resin 16 into a mold in which the fiber preform 44 and the cooling conduit 25 are placed, as shown in FIG. 7b.

As the fiber preform 44 is obtained by stacking a succession of sheets 45 of carbon fibers 15, a cooling conduit 25 is arranged between two sheets 45 of the fiber preform 44, in particular between a penultimate sheet in the stack and a last sheet in the stack.

The housing 10 can be obtained by a method of the RTM (Resin Transfer Molding) type or by infusion and autoclave.

Of course, the different characteristics, variants and/or embodiments of the present disclosure can be associated with each other in various combinations insofar as they are not incompatible or mutually exclusive.

Furthermore, the disclosure is not limited to the above-described embodiments, provided only as an example. It encompasses various modifications, alternative forms and other variants that can be considered by the skilled person within the framework of the present disclosure, including any combination of the various above-described modes of operation, which may be taken separately or in combination.

The subject matter of certain embodiments of this disclosure is described with specificity to meet statutory requirements, but this description is not necessarily intended to limit the scope of the claims. The claimed subject matter may be embodied in other ways, may include different elements or steps, and may be used in conjunction with other existing or future technologies. This description should not be interpreted as implying any particular order or arrangement among or between various steps or elements except when the order of individual steps or arrangement of elements is explicitly described.

It should be understood that different arrangements of the components depicted in the drawings or described above, as well as components and steps not shown or described are possible. Similarly, some features and sub-combinations are useful and may be employed without reference to other features and sub-combinations. Embodiments of the invention have been described for illustrative and not restrictive purposes, and alternative embodiments will become apparent to readers of this patent. Accordingly, the present invention is not limited to the embodiments described above or depicted in the drawings, and various embodiments and modifications may be made without departing from the scope of the claims below.

What is claimed:

1. A housing comprising:
a structure having a base composite wall and side composite walls extending from the base composite wall,
said base composite wall comprising a fiber preform having woven or braided carbon fibers covered with a thermoplastic or thermosetting resin,
a support mechanically linked to the base composite wall,
an electronic card carrying an electronic component, said electronic card being mounted on the support so that the electronic card is raised relative to the base composite wall,
the electronic component to be cooled carried by one face of the electronic card located on the base composite wall,
the base composite wall, the side walls, and the electronic card forming the housing, and
a heat transfer device having at least one portion facing the electronic component of the electronic card to be cooled, said heat transfer device being inserted inside the base composite wall, the heat transfer device comprising at least one cooling conduit containing a cooling fluid,
said at least one cooling conduit being inserted inside the fiber preform, and
a compressible thermal interface being arranged between the electronic component to be cooled and the base composite wall in which the at least one cooling conduit is inserted.

2. The housing according to claim 1, wherein an end of the at least one cooling conduit is flush with an outer surface of the base composite wall while sides of the at least one cooling conduit are protected by the thermoplastic or thermosetting resin.

3. The housing according to claim 1, wherein the at least one cooling conduit contains the cooling fluid in a vapor state in an evaporation zone of the at least one cooling conduit and in a liquid state in a condensation zone of the at least one cooling conduit.

4. The housing according to claim 3, wherein the at least one cooling conduit comprises a hot end close to the electronic component to be cooled and a cold end close to an edge of the housing which is outside the base composite wall.

5. The housing according to claim 3, wherein the at least one cooling conduit is a diphasic capillary-pumping loop.

6. The housing according to claim 1, wherein the heat transfer device further comprises a cold plate made of a heat-conducting material in which is provided the at least one cooling conduit for the cooling fluid in a liquid phase.

7. The housing according to claim 6, wherein the at least one cooling conduit of the cold plate is intended to be connected to a fluid circuit available in an aircraft.

8. The housing according to claim 1, wherein the heat transfer device further comprises an insert made of a metallic material comprising at least one bore forming the at least one cooling conduit.

9. The housing according to claim 8, wherein the insert comprises a plurality of cooling fins extending outwards from said housing.

10. The housing according to claim 1, wherein the support comprises at least one bore forming a conduit for a passage of the cooling fluid.

11. The housing according to claim 1, wherein the woven or braided carbon fibers have a thermal conductivity comprised between 300 W/m*K to 800 W/m*K.

\* \* \* \* \*